(12) United States Patent
Yamada et al.

(10) Patent No.: US 8,149,008 B2
(45) Date of Patent: Apr. 3, 2012

(54) PROBE CARD ELECTRICALLY CONNECTABLE WITH A SEMICONDUCTOR WAFER

(75) Inventors: Yoshio Yamada, Nagano (JP); Hiroshi Nakayama, Nagano (JP); Tsuyoshi Inuma, Nagano (JP); Takashi Akao, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 12/452,716

(22) PCT Filed: Jul. 16, 2008

(86) PCT No.: PCT/JP2008/062849
§ 371 (c)(1),
(2), (4) Date: May 11, 2010

(87) PCT Pub. No.: WO2009/011365
PCT Pub. Date: Jan. 22, 2009

(65) Prior Publication Data
US 2010/0219852 A1    Sep. 2, 2010

(30) Foreign Application Priority Data

Jul. 19, 2007    (JP) .................................. 2007-188546

(51) Int. Cl.
*G01R 31/20* (2006.01)
(52) U.S. Cl. ............... 324/754.01; 324/754.03; 324/500
(58) Field of Classification Search .................. None
See application file for complete search history.

(56) References Cited

U.S. PATENT DOCUMENTS

| 7,368,927 | B2* | 5/2008 | Smith et al. ............. 324/754.07 |
| 2008/0100320 | A1* | 5/2008 | Miller et al. ................. 324/754 |
| 2009/0058440 | A1 | 3/2009 | Miura et al. |
| 2009/0219043 | A1 | 9/2009 | Nakayama et al. |
| 2009/0284273 | A1 | 11/2009 | Hasegawa |

FOREIGN PATENT DOCUMENTS

| JP | 2001-524258 | 11/2001 |
| JP | 3386077 | 1/2003 |

(Continued)

OTHER PUBLICATIONS

International Search Report and Written Opinion dated Aug. 12, 2008 issued in International Application No. PCT/JP2008/062849.

*Primary Examiner* — Melissa Koval
*Assistant Examiner* — Trung Nguyen
(74) *Attorney, Agent, or Firm* — Edwards Wildman Palmer LLP

(57) ABSTRACT

A probe card includes a probe head that holds a plurality of probes; a flat wiring board that has a wiring pattern corresponding to a circuit structure; an interposer that is stacked on the wiring board and relays wirings of the wiring board; a space transformer that is placed between the interposer and the probe head, transforms a space between the wirings relayed by the interposer, and leads the transformed wirings out to a surface facing the probe head; and a plurality of post members that are formed in a substantially columnar shape with a height larger than a sum of a thickness of the wiring board and a thickness of the interposer, and embedded to pierce through the wiring board and the interposer in a thickness direction such that one of end surfaces of each post member comes into contact with the space transformer.

3 Claims, 11 Drawing Sheets

FOREIGN PATENT DOCUMENTS

| | | |
|---|---|---|
| JP | 2005-164600 | 6/2005 |
| JP | 2007-3334 | 1/2007 |
| WO | WO-96/15458 | 5/1996 |
| WO | WO-96/38858 | 12/1996 |
| WO | WO-2006/126279 | 11/2006 |
| WO | WO-2007/015314 | 2/2007 |
| WO | WO-2007/046153 | 4/2007 |
| WO | WO-2007/066622 | 6/2007 |

* cited by examiner

PROBE CARD ELECTRICALLY CONNECTABLE WITH A SEMICONDUCTOR WAFER

TECHNICAL FIELD

The present invention relates to a probe card that electrically connects a semiconductor wafer as a test object and a circuit structure for generating a signal for a test.

BACKGROUND ART

In a semiconductor test process, an electric characteristic test such as a conductivity test is performed to detect a defective product by bringing probes having conductivity (conductive probes) into contact with a semiconductor wafer before dicing (wafer level test). When this wafer level test is performed, to transfer a signal for a test to the semiconductor wafer, a probe card housing a large number of probes is used. In the wafer level test, the probes are individually brought into contact with each of dies on the semiconductor wafer while the dies are scanned by the probe card. Because several hundreds to several ten thousands dies are formed on the semiconductor wafer, it takes considerable time to test one semiconductor wafer. Thus, an increase in the number of dies causes higher costs.

To solve the problem of the wafer level test, a method called full wafer level test is also used in recent years in which several hundreds to several ten thousands probes are collectively brought into contact with all or at least a quarter to a half of dies on a semiconductor wafer (see, for example, Patent Document 1). To accurately bring the probes into contact with electrode pads on the semiconductor wafer, technologies for maintaining positional accuracy of tips of probes by accurately keeping the parallelism or the flatness of a probe card with respect to a surface of the semiconductor wafer and for highly accurately aligning a semiconductor wafer are known in this method (see, for example, Patent Document 2 or 3).

FIG. 11 is a partial sectional view showing the structure of a probe card applied in the full wafer level test. A probe card 9 shown in the figure includes a probe head 91 that houses a plurality of probes 10 provided corresponding to an arrangement pattern of the electrode pads on a semiconductor wafer, a space transformer 92 that transforms a space in a fine wiring pattern in the probe head 91, an interposer 93 that relays wirings w led out from the space transformer 92, a wiring board 94 that connects wirings relayed by the interposer 93 to a testing device, a male connector 95 provided on the wiring board 94 and is to be connected to a female connector provided on the testing device side, and a reinforcing member 96 that reinforces the wiring board 94.

As the interposer 93, the one that has a thin-film base member made of an insulating material and a plurality of leaf-spring connection terminals disposed in a predetermined pattern on both sides of the base member and formed in a cantilever shape is known. In this interposer, the connection terminals provided on one surface of the interposer 93 come into contact with electrode pads of the space transformer 92 and the connection terminals provided on the other surface come into contact with electrode pads of the wiring board 94, whereby electrical connection is established between the space transformer 92 and the wiring board 94.

Patent Document 1: Japanese Patent Publication No.
Patent Document 2: Japanese Patent No. 3386077
Patent Document 3: Japanese Patent Application Laid-open No. 2005-164600

DISCLOSURE OF INVENTION

Problem to be Solved by the Invention

However, when the conventional probe card represented by the probe card 9 is applied to the full wafer level test, because the diameter of a wiring board is increased to about 8 to 12 inches (about 200 to 300 mm), deformation such as warp or waviness is likely to occur in the wiring board. This causes a reduction in accuracy of the parallelism of the probe head or accuracy of the flatness of the probe head with respect to a predetermined reference surface.

Furthermore, with the conventional probe card, when warp is caused in the space transformer by elastic force applied by the interposer, the probe head also warps following the space transformer. Therefore, similarly to the case where the wiring board is deformed, accuracy of the parallelism of the probe head or accuracy of the flatness of the probe head with respect to the predetermined reference surface are sometimes reduced.

The present invention has been made in view of the above, and it is an object of the present invention to provide a probe card that can improve accuracy of the parallelism or accuracy of the flatness of a probe head, which houses probes that input and output an electrical signal between different circuit structures, with respect to a predetermined reference surface.

Means for Solving Problem

To solve the problem described above and achieve the object, a probe card according to the present invention that electrically connects, using a plurality of probes, a semiconductor wafer and a circuit structure for generating a signal to be output to the semiconductor wafer, each probe is made of a conductive material and is extensible and compressible by elastic force along a longitudinal direction thereof, includes a probe head that holds the plurality of probes; a wiring board that has a wiring pattern corresponding to the circuit structure; a flat interposer that is stacked on the wiring board and relays wirings of the wiring board; a flat space transformer that is placed between the interposer and the probe head, transforms a space between the wirings relayed by the interposer, and leads the transformed wirings out to a surface facing the probe head; and a plurality of post members that are formed in a substantially columnar shape with a height larger than a sum of a thickness of the wiring board and a thickness of the interposer, and embedded to pierce through the wiring board and the interposer in a thickness direction such that one of end surfaces of each post member comes into contact with the space transformer.

In the probe card according to the present invention as set forth in the invention described above, the interposer and the space transformer are fixedly attached to each other.

In the probe card according to the present invention as set forth in the invention described above, a plurality of connection terminals, each of which is made of a conductive material and is extensible and compressible by elastic force along a longitudinal direction thereof and a housing member that is made of a flat insulating material and includes a plurality of through holes to individually house the connection terminals are further included, and both ends of each of the connection terminals in the longitudinal direction are exposed from the housing member.

In the probe card according to the present invention as set forth in the invention described above, a reinforcing member that is attached to the wiring board and reinforces the wiring board is further included, and the plurality of post members are fixedly attached to the reinforcing member.

Effect of the Invention

According to the probe card of the present invention, the plurality of post members is provided, each of which is formed in a substantially columnar shape with a height larger than the sum of the thickness of the wiring board and the thickness of the interposer, and embedded to pierce through the wiring board and the interposer in a thickness direction such that one of end surfaces of each post member comes into contact with the space transformer. Therefore, it is possible to improve accuracy of the parallelism and accuracy of the flatness of the probe head, which houses probes that input and output an electrical signal between different circuit structures, with respect to a predetermined reference surface.

Figure 1:
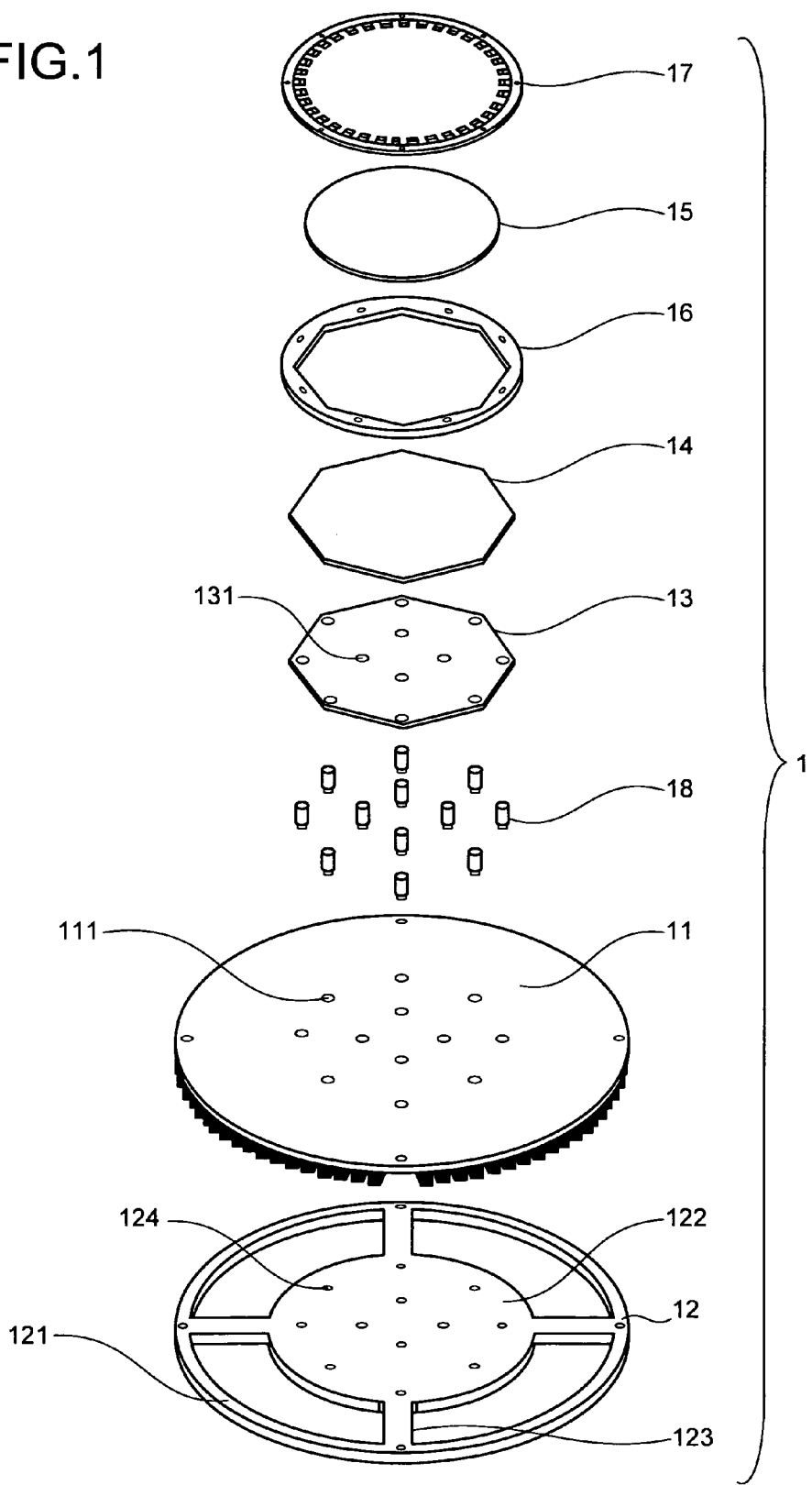
FIG. 1 is an exploded perspective view showing the structure of a probe card according to a first embodiment of the present invention.

EXPLANATIONS OF LETTERS OR NUMERALS 1, 6, 7, 8, 9 Probe card
2, 10 Probe
3 Prober
4 Connector seat
5 Semiconductor wafer
11, 61, 94 Wiring board
12, 62, 82, 96 Reinforcing member
13, 63, 93 Interposer
14, 92 Space transformer
15, 91 Probe head
15p Probe housing area
16 Holding member
17 Leaf spring
18, 83 Post member
18a, 83a Large diameter portion
18b, 83b Small diameter portion
71 Adhesive
20, 95 Male connector
21, 22 Plunger
21a, 22a, 134a, 135a Tip portion
21b, 134c, 135c Boss portion
21c Shaft portion
22b, 134b, 135b Flange portion
22c, 134d, 135d Base end portion
23, 136 Spring member
23a, 136a Roughly wound portion
23b, 136b Closely wound portion
31 Probe card holder
32 Pressing jig
40 Female connector
50 Wafer chuck
51, 112, 141, 142 Electrode pad
84 Bolt
111, 131, 137, 138, 151, 611, 821 Through hole
121 Outer peripheral portion
122 Central portion
123 Coupling portion
124, 624 Recess
132 Housing member
132a First member
132b Second member
133 Connection terminal
134, 135 Plunger
137a, 138a, 151a, 821a Small diameter hole
137b, 138b, 151b, 821b Large diameter hole
171 Pawl
w Wiring

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and width of each portion, a ratio of the thicknesses of the respective portions and the like may be different from realistic ones. It goes without saying that, the drawings may depict some portion as having different relations and ratios of dimensions.

First Embodiment

Figure 2:
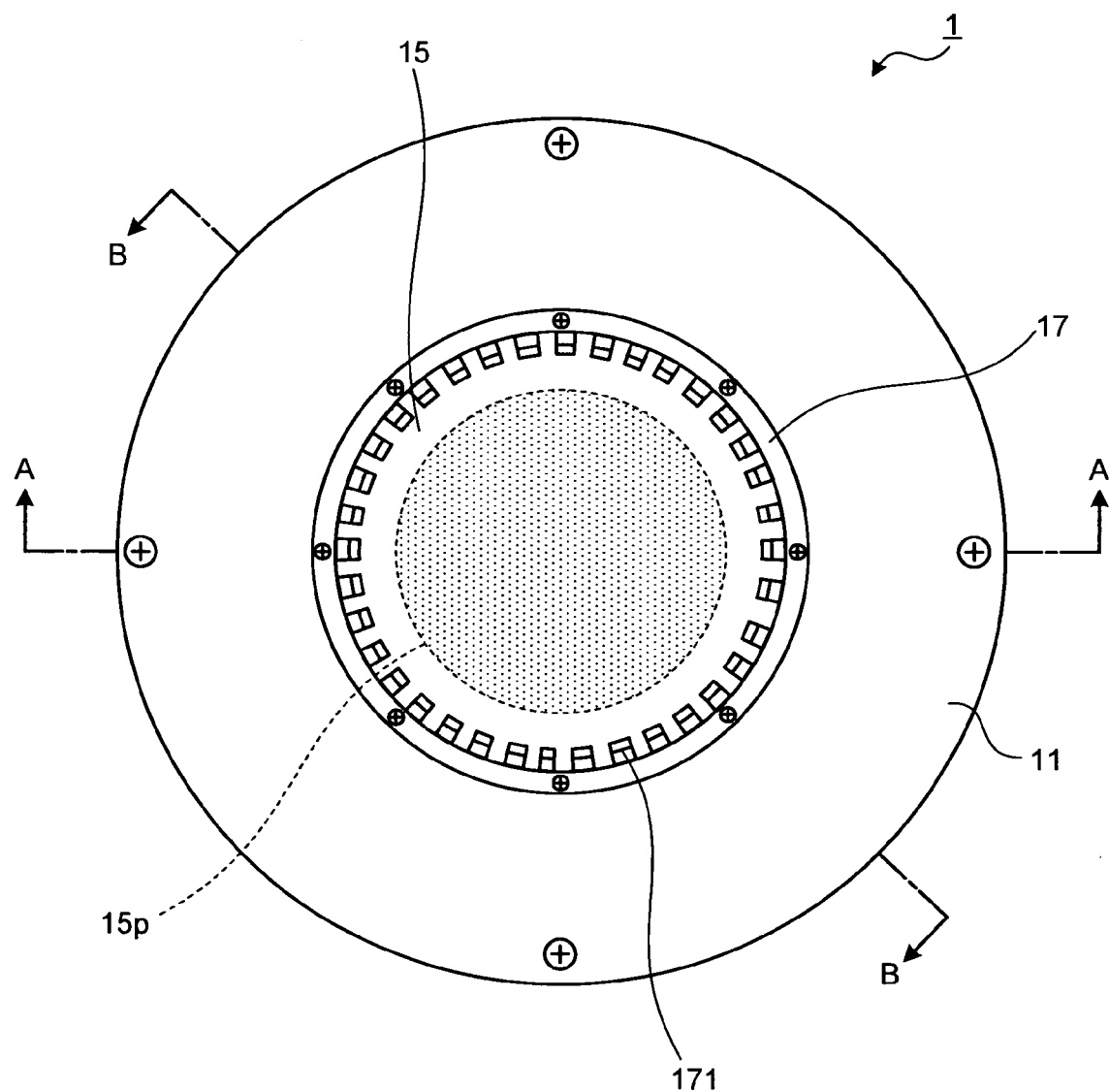
FIG. 2 is a plan view showing the structure of the probe card according to the first embodiment of the present invention.
Figure 3:
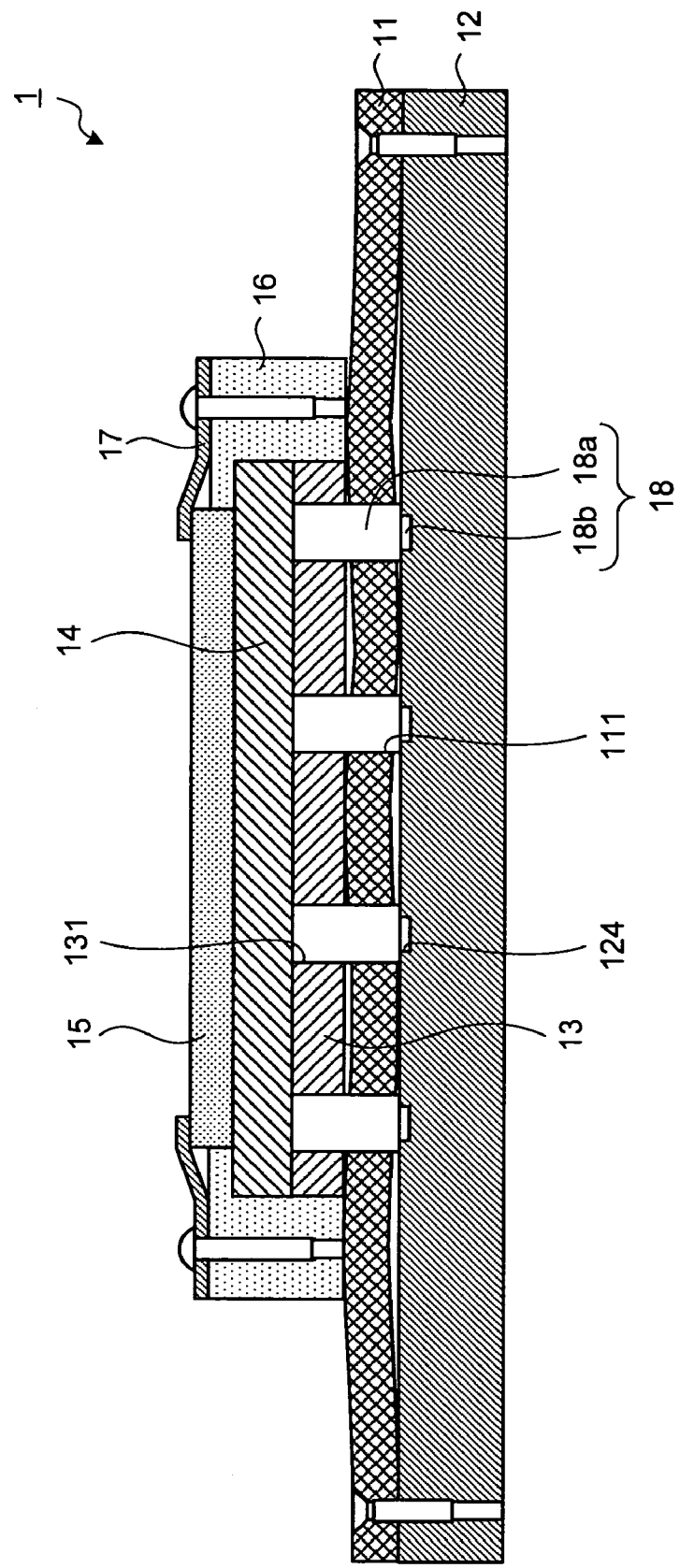
FIG. 3 is a partial sectional view taken along A-A line shown in FIG. 2.
Figure 4:
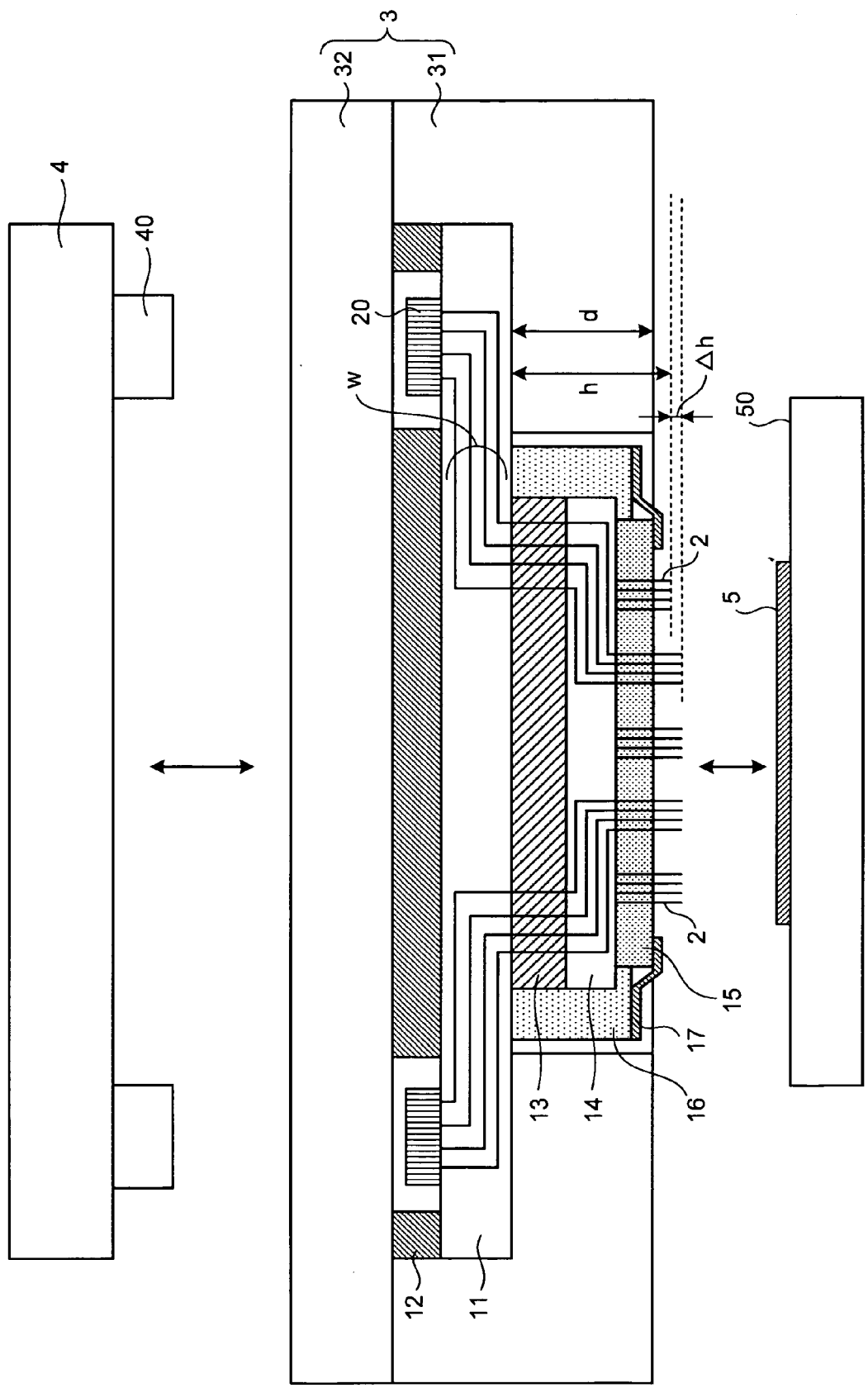
FIG. 4 is a diagram showing an overview of a test performed using the probe card according to the first embodiment of the present invention.

FIG. 1 is an exploded perspective view showing the structure of a probe card according to a first embodiment of the present invention. FIG. 2 is a plan view showing the probe card according to the first embodiment. FIG. 3 is a partial sectional view taken along A-A line shown in FIG. 2. FIG. 4 is a schematic diagram showing a section taken along B-B line shown in FIG. 2 including part of wirings and an overview of an electric characteristic test performed using the probe card according to the first embodiment. In FIG. 4, to bring a top and a bottom in line with those at the time of actual test, a probe card 1 is illustrated upside down with respect to FIG. 3. The probe card 1 shown in FIGS. 1 to 4 is a device that electrically connects a semiconductor wafer 5 as a test object and a testing device that has a circuit structure for generating a signal for a test.

The probe card 1 is formed in a disk shape and includes a wiring board 11 that establishes electrical connection to the testing device; a reinforcing member 12 that is attached to one surface of the wiring board 11 and reinforces the wiring board 11; an interposer 13 that relays wirings from the wiring board 11; a space transformer 14 that transforms a space of the wirings relayed by the interposer 13, a probe head 15 that is formed in a disk shape having a diameter smaller than that of the wiring board 11, stacked on the space transformer 14, and houses and holds a plurality of probes 2 in accordance with a wiring pattern of the semiconductor wafer 5 as the test object; a holding member 16 that is fixedly attached to the wiring board 11 and collectively holds the interposer 13 and the space transformer 14 in a stacked state; a leaf spring 17 that is fixedly attached to the holding member 16 and fixes an end of the probe head 15; and a plurality of post members 18 embedded to pierce through the wiring board 11 and the interposer 13 in a thickness direction.

The wiring board 11 is formed using an insulating material such as Bakelite or epoxy resin. In the wiring board 11, a wiring layer for electrically connecting the plurality of probes 2 and the testing device is formed three-dimensionally by via holes and the like. The wiring board 11 has a plurality of through holes 111 pierced in a thickness direction. In FIG. 3, a state in which the wiring board 11, which is originally flat, is deformed and a longitudinal section of the wiring board 11 becomes wavy is illustrated.

As shown in FIG. 4, one ends of wirings w formed in the wiring board 11 are connected to a plurality of male connectors 20 disposed on a surface of the wiring board 11, which is a surface on a side where the reinforcing member 12 is attached, to perform connection to the testing device (not shown). In contrast, the other ends of the wirings w are electrically connected via the space transformer 14 to the probes 2, which are housed and held by the probe head 15.

The male connectors 20 are disposed radially with respect to the center of the wiring board 11, form pairs with respective female connectors 40 provided in positions opposed to the male connectors 20 on a connector seat 4 of the testing device, and establish electrical connection between the probes 2 and the testing device when terminals of the male connectors 20 and the female connectors 40 come into contact with each other. As a connector including the male connectors 20 and the female connectors 40, a zero insertion force (ZIF) type connector that requires almost no external force for inserting and pulling out male connectors and applies press contact force using external force after connectors are joined can be applied. If this ZIF type connector is applied, the probe card 1 and the testing device hardly suffer stress due to connection even if the number of the probes 2 is large. Therefore, electrical connection can be reliably obtained, and durability of the probe card 1 can be improved.

The female connectors can be disposed on the wiring board 11 and the male-connectors can be disposed on the connector seat 4. Furthermore, instead of the connector, terminals such as pogo pins having a spring action can be provided in the testing device to connect the probe card 1 to the testing device via these terminals.

The reinforcing member 12 includes, as shown in FIG. 1, a circular outer peripheral portion 121 that has substantially the same diameter as that of the wiring board 11, a central portion 122 that has the same center as that of a circle formed by the outer peripheral portion 121 and is formed in a disc shape having a surface area slightly larger than an area of the surface of the interposer 13, and a plurality of coupling portions 123 that extend from an outer peripheral direction of the central portion 122 to reach the outer peripheral portion 121 and couple the outer peripheral portion 121 and the central portion 122. A plurality of recesses 124, on which ends of the post members 18 (small diameter portions 18$b$ to be described later) are placed, are formed in the central portion 122 of the reinforcing member 12. The reinforcing member 12 is realized by a material of high hardness such as alumite-finished aluminum, stainless steel, invar material, Kovar material (registered trademark), or duralumin.

The interposer 13 has regular octagonal surfaces, and is formed in a thin plate shape. On the interposer 13, a plurality of through holes 131 that pierce through in a thickness direction and have substantially the same diameter as that of the through holes 111 in the wiring board 11 are formed. Each of the through holes 131 communicates with one of the plurality of through holes 111 of the wiring board 11 in a stacked state on the wiring board 11.

Figure 5:
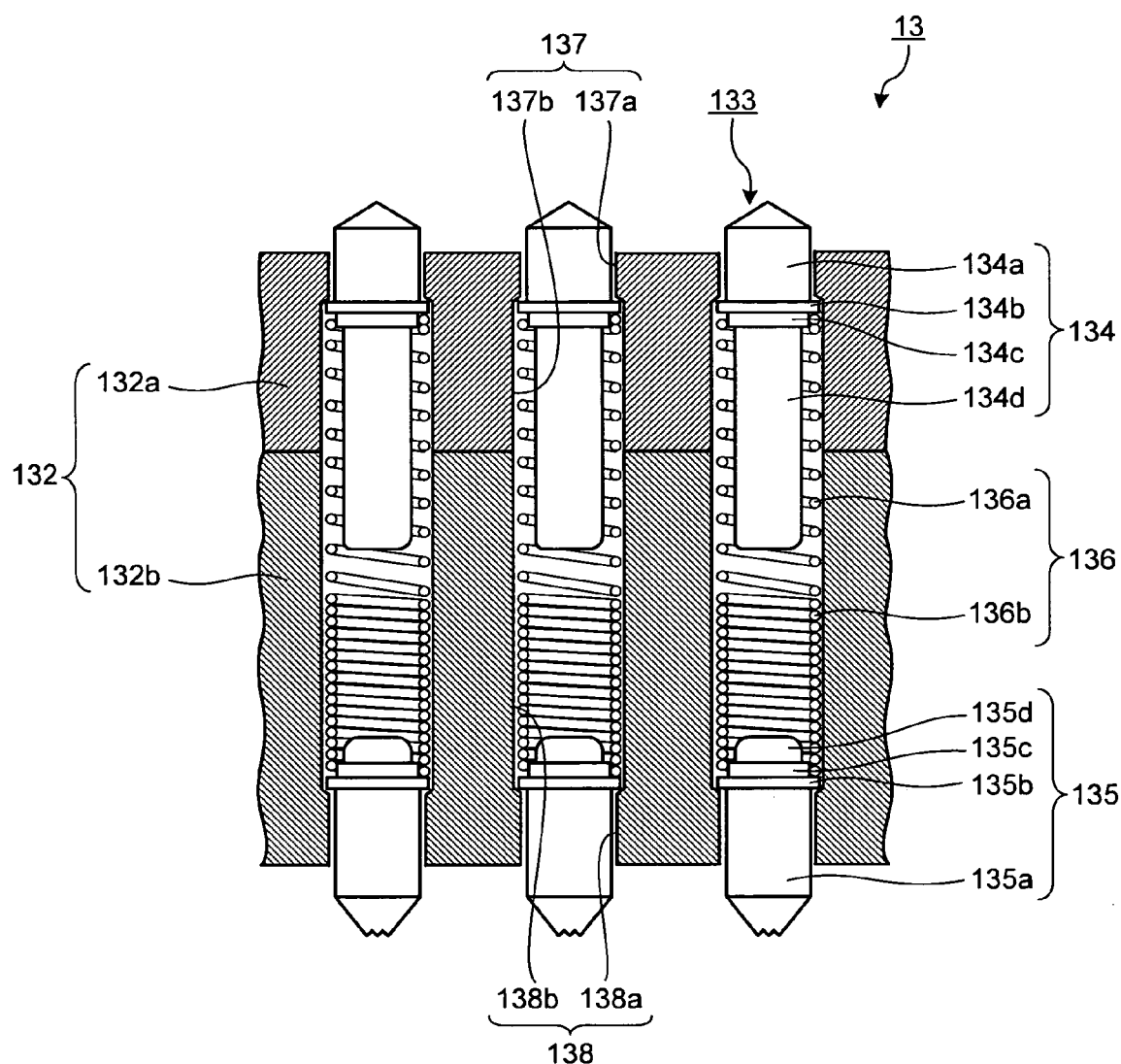
FIG. 5 is a partial sectional view showing the internal structure of an interposer included in the probe card according to the first embodiment of the present invention.

FIG. 5 is an enlarged partial sectional view showing the detailed internal structure of the interposer 13. As shown in FIG. 5, the interposer 13 includes a plurality of connection terminals 133 housed and held in a housing member 132. The connection terminals 133 include plungers 134 to be brought into contact with the wiring board 11, plungers 135 to be brought into contact with the space transformer 14, and coil-like spring members 136 that are provided between the plungers 134 and 135 and resiliently couple the plungers 134 and 135. The plungers 134 and 135 coupled to each other and the spring members 136 have identical axes.

The plungers 134 include tip portions 134$a$ that have sharp tips; flange portions 134$b$ that have a diameter larger than a diameter of the tip portions 134$a$; boss portions 134$c$ that project in the opposite direction of the tip portions 134$a$ via the flange portions 134$b$, have a diameter smaller than the diameter of the flange portions 134$b$ and slightly larger than an inner diameter of the spring members 136, and onto which end portions of spring members 23 are pressed; and base end portions 134$d$ that are formed in a cylindrical shape having a diameter smaller than the diameter of the boss portions 134$c$ and smaller than the inner diameter of the spring members 136, and extend out from the boss portions 134$c$ on the opposite side of the flange portions 134$b$. The plungers 134 are formed in a shape axially symmetrical with respect to central axes thereof in a longitudinal direction.

The plungers 135 include tip portions 135$a$ that are formed in a crown shape having a plurality of projecting pawls; flange portions 135$b$ that have a diameter larger than a diameter of the tip portions 135$a$; boss portions 135$c$ that project in the opposite direction of the tip portions 135$a$ via the flange portions 135$b$, have a diameter smaller than the diameter of the flange portions 135$b$ and slightly larger than the inner diameter of the spring members 136, and onto which end portions of the spring members 136 are pressed; and base end portions 135$d$ that are formed in a cylindrical shape having a diameter smaller than the diameter of the boss portions 135$c$ and smaller than the inner diameter of the spring members 136, and extend out from the boss portions 135$c$ on the opposite side of the flange portions 135$b$. The plungers 135 are formed in a shape axially symmetrical with respect to central axes thereof in a longitudinal direction. The diameter of the flange portions 135$b$ is the same as the diameter of the flange portions 134$b$, and the diameter of the base end portions 135$d$ is the same as the diameter of the base end portions 134$d$.

The plungers 134 attachment sides of the spring members 136 are loosely wound portions 136$a$, while the plungers 135 attachment sides thereof are tightly wound portions 136$b$. Ends of the loosely wound portions 136$a$ come into contact with the flange portions 134b, and ends of the tightly wound portions 136b come into contact with the flange portions 135b.

The housing member 132 that houses the connection terminals 133 includes a first member 132a and a second member 132b that are stacked one on top of the other. Through holes 137 that individually house the plurality of connection terminals 133 are formed in the first member 132a. The through holes 137 include small diameter holes 137a that have a diameter slightly larger than the diameter of the tip portions 134a and large diameter holes 137b that have a diameter slightly larger than that of the flange portions 134b. The small diameter holes 137a and the large diameter holes 137b are formed in a stepped hole shape having identical axes. Through holes 138 that individually house the plurality of connection terminals 133 are formed in the second member 132b. The through holes 138 communicate with the through holes 137, and include small diameter holes 138a that have a diameter slightly larger than the diameter of the tip portions 135a, and large diameter holes 138b that have a diameter slightly larger than that of the flange portions 135b. The small diameter holes 138a and the large diameter holes 138b are formed in a stepped hole shape having identical axes. Each of the through holes 137 and 138 constitutes a part of the through holes 131.

In FIG. 5, the flange portions 134b of the plungers 134 are brought into contact with bumps forming a boundary between the large diameter holes 137b and the small diameter holes 137a of the through holes 137 in the first member 132a, whereby the plungers 134 are prevented from coming off from the housing member 132. Similarly, the flange portions 135b of the plungers 135 are brought into contact with bumps forming a boundary between the small diameter holes 138a and the large diameter holes 138b of the through holes 138 in the second member 132b, whereby the plungers 135 are prevented from coming off from the housing member 132.

Figure 6:
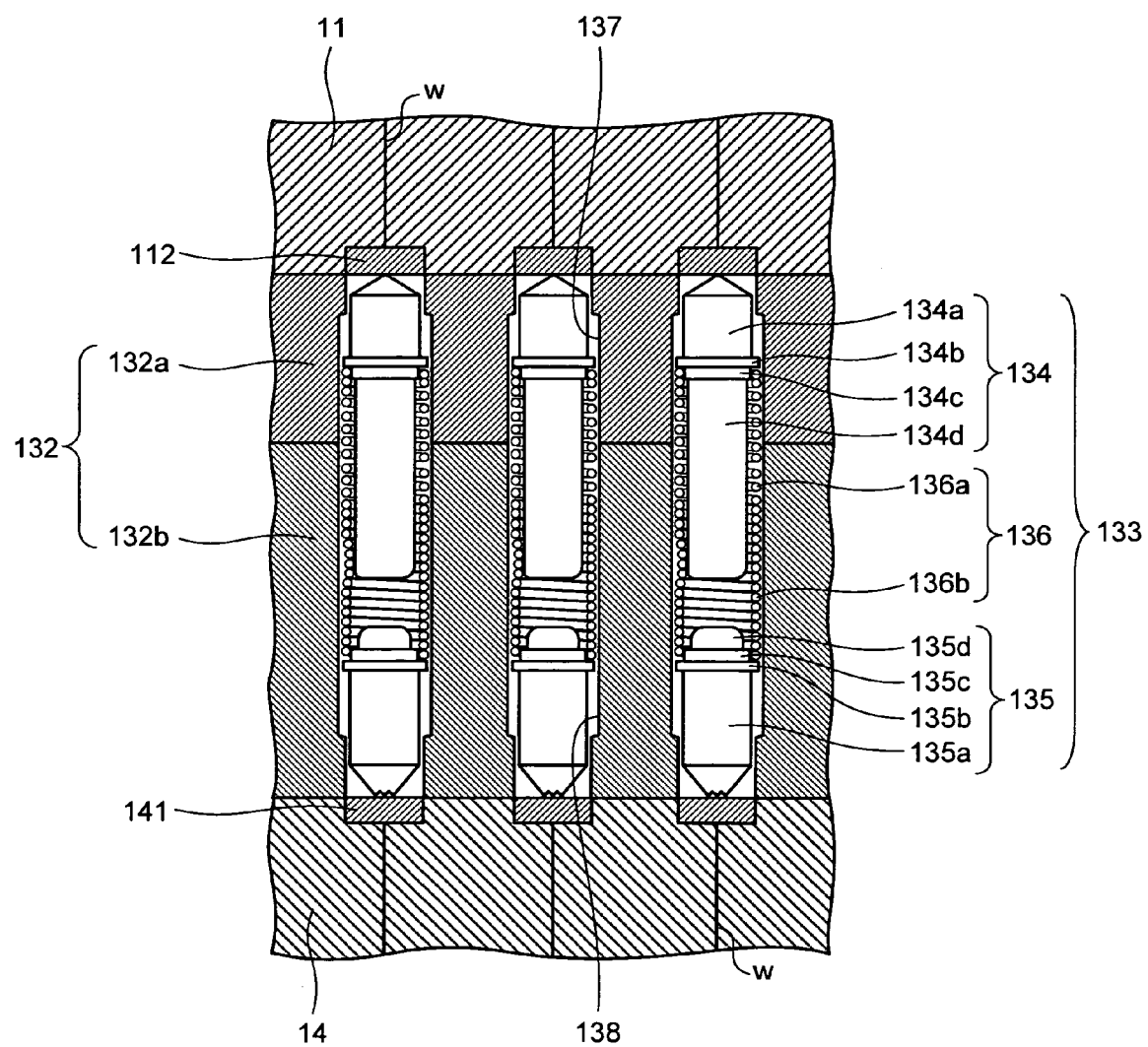
FIG. 6 is a partial sectional view showing the structure of the probe card around the interposer in the probe card according to the first embodiment of the present invention.

FIG. 6 is a diagram showing the structure of the probe card 1 around the interposer 13. The interposer 13 shown in the figure is placed between the wiring board 11 and the space transformer 14. The tips of the plungers 134 come into contact with electrode pads 112 of the wiring board 11, and the tips of the plungers 135 come into contact with electrode pads 141 of the space transformer 14, whereby the interposer 13 relays electrical connection between the wiring board 11 and the space transformer 14.

In FIG. 6, the spring members 136 are curved such that a portion of the tightly wound portions 136b come into contact with the base end portions 134d of the plungers 134. Consequently, electrical continuity in the shortest path via the plungers 134, the tightly wound portions 136b of the spring members 136, and the plungers 135 in sequence can be realized. As a result, increase in the inductance of the connection terminals 133 can be suppressed.

Each of the connection terminals 133 of the interposer 13 having the structure described above is individually extensible and compressible. Therefore, the interposer 13 can follow the deformation of the wiring board 11 and the space transformer 14. Consequently, it is possible to prevent a part of wirings from being disconnected due to the deformation of the wiring board 11 or/and the space transformer 14, and a difference between a coefficient of thermal expansion of the semiconductor wafer 5 and a coefficient of thermal expansion of the wiring board 11 can be absorbed.

While the plungers 134 and 135 of the connection terminals 133 applied to the interposer 13 are respectively formed in different shapes, it is possible to connect plungers in identical shapes to each other via the spring members 136. Furthermore, it is possible to arrange the plungers 134 and the plungers 135 in reverse to each other in a vertical direction.

The space transformer 14 is made of an insulating material such as ceramics used as a base material, and in which an internal wiring layer is formed three-dimensionally by via holes and the like similarly to the wiring board 11. The space transformer 14 has regular octagonal surfaces substantially congruent with the interposer 13, and is formed in a thin plate shape.

Figure 7:
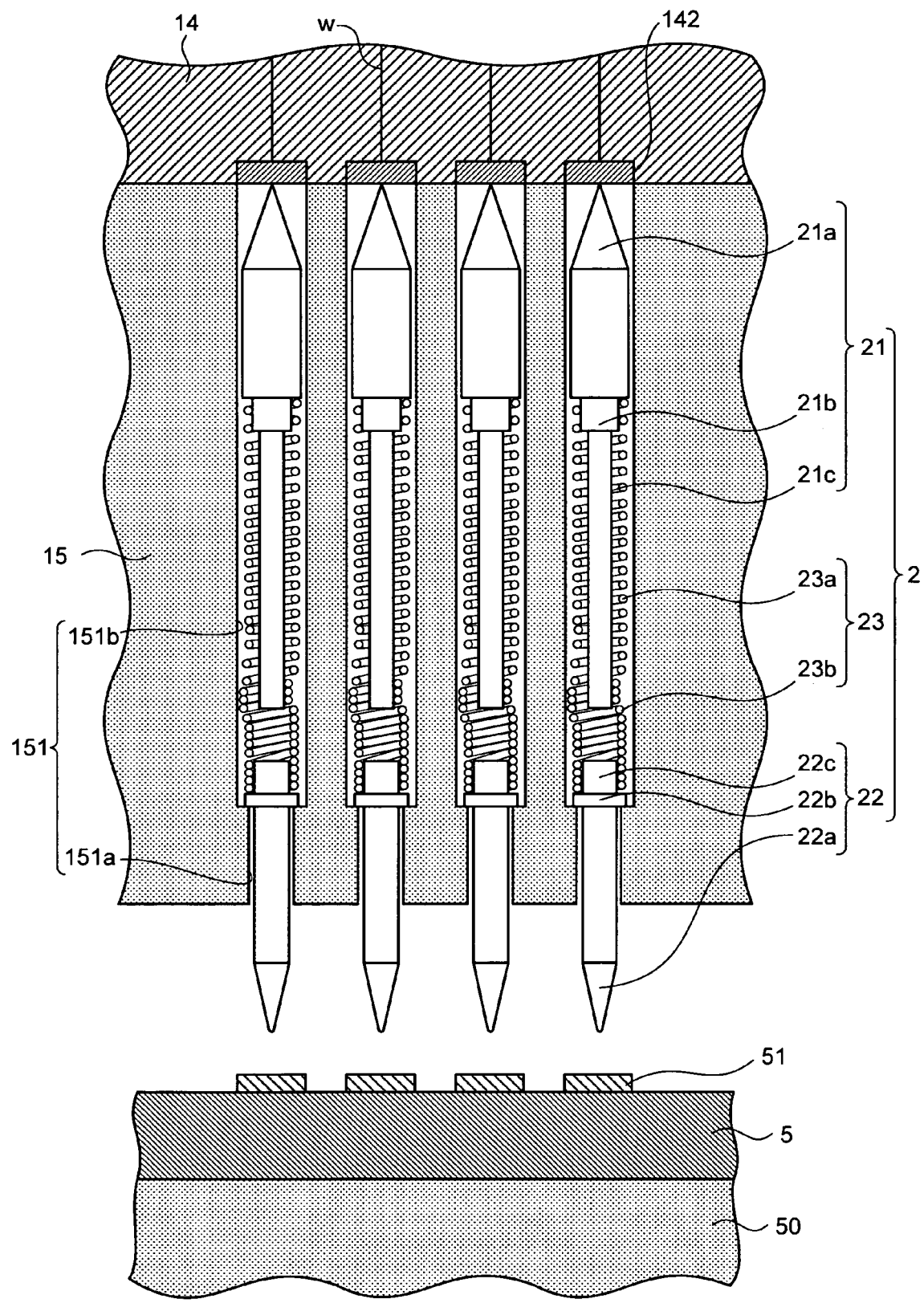
FIG. 7 is a partial sectional view showing the structure of probes and a main part of a probe head.

FIG. 7 is an enlarged partial sectional view of the structure of a main part of the probe head 15 and the detailed structure of the probes 2. The probes 2 include plungers 21 that come into contact with the space transformer 14; plungers 22 that project in a direction opposite to the plungers 21 and come into contact with electrode pads 51 of the semiconductor wafer 5; and the coil-like spring members 23 that are provided between the plungers 21 and 22 and resiliently couple the plungers 21 and 22. The plungers 21 and 22 coupled to each other and the spring members 23 have identical axes.

The plungers 21 include tip portions 21a that have sharp tips, boss portions 21b that are provided in base end sides of the tip portions 21a and have a diameter smaller than a diameter of the tip portions 21a, and shaft portions 21c that extend out from surfaces on the opposite side of sides of the boss portions 21b in contact with the tip portions 21a. The plungers 22 include tip portions 22a that have sharp tips, flange portions 22b that are provided in base end sides of the tip portions 22a and have a diameter larger than a diameter of the tip portions 22a, and a boss-like base end portions 22c that project from surfaces of the flange portions 22b in a direction opposite to the tip portions 22a and have a diameter smaller than the diameter of the flange portions 22b.

The plungers 21 attachment sides of the spring members 23 are loosely wound portions 23a, while the plungers 22 attachment sides of the spring members 23 are tightly wound portions 23b. Ends of the loosely wound portions 23a are pressed onto the boss portions 21b, and ends of the tightly wound portions 23b are pressed onto the base end portions 22c.

In the probes 2 having the structure described above, at least a part of the tightly wound portions 23b are in contact with the shaft portions 21c in a state in which the plungers 21 are in contact with electrode pads 142 of the space transformer 14 (a state shown in FIG. 7).

The probe head 15 is formed using an insulating material such as ceramics. On a probe housing area 15p shown in FIG. 2, through holes 151 for housing the probes 2 are formed in a thickness direction (vertical direction in FIG. 7) corresponding to an array of the electrode pads 51 of the semiconductor wafer 5. The through holes 151 include small diameter holes 151a formed from an end face on the semiconductor wafer 5 side over at least predetermined length smaller than the length in a longitudinal direction of the tip portions 22a, and large diameter holes 151b that have the same central axes as those of the small diameter holes 151a and have a diameter larger than that of the small diameter holes 151a. An inner diameter of the small diameter holes 151a is slightly larger than an outer diameter of the tip portions 22a and slightly smaller than an outer diameter of the flange portions 22b. Therefore, the through holes 151 prevent the plungers 22 from coming off.

It is possible to fix the probe head 15 to the space transformer 14 by screws and the like. With this, it is possible to suppress warp of the probe head 15 due to loads of the plungers 22.

The holding member 16 is made of the same material as that of the reinforcing member 12 and has a hollow portion of a regular octagonal pole in which the interposer 13 and the space transformer 14 can be stacked and held. The holding member 16 presses the interposer 13 and the space transformer 14 against the wiring board 11 and holds the interposer 13 and the space transformer 14 to thereby apply pressure necessary for electrically connecting the wiring board 11 and the space transformer 14 via the interposer 13.

The leaf spring 17 is made of a material having elasticity such as phosphor bronze, stainless steel (SUS), or beryllium copper and formed in a thin annular shape. In an inner circumference of the leaf spring 17, pawls 171 as pressing members for holding the interposer 13, the space transformer 14, and the probe head 15 are uniformly provided over the entire circumference. The pawls 171 uniformly press a portion near an edge of the surface of the probe head 15 over the entire circumference in the direction of the wiring board 11. Therefore, a substantially uniform initial load is generated in the probes 2 housed in the probe head 15, so that warp of the probe head 15 can be prevented.

The post members 18 are formed in a substantially columnar shape, and include large diameter portions 18a of a cylindrical shape with a height slightly larger than the sum of the thickness of the wiring board 11 and the thickness of the interposer 13 and small diameter portions 18b of a cylindrical shape having a diameter smaller than that of the large diameter portions 18b and the same central axes as those of the large diameter portions 18a. The large diameter portions 18a pass through the through holes 111 of the wiring board and the through holes 131 of the interposer 13. The small diameter portions 18b have substantially the same diameter as that of the recesses 124 of the reinforcing member 12, and are fitted in the recesses 124. End surfaces of the large diameter portions 18a on a side where the small diameter portions 18b do not protrude come into contact with a surface of the space transformer 14. The post members 18 having the structure described above can be made of the same material as that of the reinforcing member 12. In view of required high machining accuracy, stainless steel is preferable.

The post members 18 are arranged symmetrically to the center of the regular octagon formed by the surface of the interposer 13 (see FIG. 1). Furthermore, the plurality of post members 18 is arranged in a surrounding area excluding the center of the regular octagon formed by the surface of the interposer 13. By embedding the post members 18 arranged in this manner to pierce through the wiring board 11 in its thickness direction and the interposer 13 in its thickness direction, it is possible to define the height in the thickness direction of a portion where the wiring board 11 and the interposer 13 are stacked, in accordance with the height of the post members 18. Therefore, even if deformation occurs in the wiring board 11, it is possible to suppress the effect, which is caused by the deformation, on the parallelism of the probe head 15 and the flatness of the probe head 15 with respect to a predetermined reference surface. In addition, because the end surfaces of the post members 18 come into direct contact with the surface of the space transformer 14, even if elastic force is applied from the connection terminals 133 held by the interposer 13 or the probes 2 held by the probe head 15, it is possible to ensure the parallelism between the space transformer 14 and the reinforcing member 12.

An overview of a test of the semiconductor wafer 5 performed by using the probe card 1 having the structure described above is explained with reference to FIGS. 4 and 7. As shown in FIG. 4, in the test, the probe card 1 is mounted on a prober 3 that is a device for bringing the probes 2 and the semiconductor wafer 5 into contact with each other. The prober 3 includes a probe card holder 31 on which a bottom surface of the wiring board 11 is placed and held and a pressing jig 32 that is located above the probe card holder 31 and presses the probe card 1 downward to fix the probe card 1.

The contact between the probes 2 and the semiconductor wafer 5 is realized by raising a wafer chuck 50, on which the semiconductor wafer 5 is placed, with predetermined driving means. To allow the electrode pads 51 of the semiconductor wafer 5 and the tip portions 22a of the plungers 22 to accurately come into contact with each other, the tip height h of the probes 2 after being stroked by the contact needs to be larger than the thickness d of the probe card holder 31 (h>d). In FIG. 4, tip positions of the probes 2 in contact with the semiconductor wafer 5 are schematically indicated by a group of (four) probes 2 held at the right end of the probe head 15. Furthermore, in FIG. 4, a stroke amount of the probes 2 by the contact with the semiconductor wafer 5 is represented as Δh.

When the electrode pads 51 of the semiconductor wafer 5 are brought into contact with the tip portions 22a by raising the wafer chuck 50 from the state shown in FIG. 7, the plungers 22 rise and the spring members 23 are compressed and further curved. In this state, a part of the tightly wound portions 23b maintain a state of contact with the shaft portions 21c of the plungers 21. Therefore, electrical continuity in the shortest path via the plungers 21, the tightly wound portions 23b of the spring members 23, and the plungers 22 in sequence can be realized. Consequently, increase in the inductance of the probes 2 can be suppressed.

According to the first embodiment of the present invention explained above, a plurality of post members are provided, which are formed in a substantially columnar shape with a height larger than the sum of the thickness of the wiring board and the thickness of the interposer, and embedded to pierce through the wiring board and the interposer in the thickness direction such that one of end surfaces of each post member comes into contact with the space transformer. Therefore, it is possible to improve accuracy of the parallelism and accuracy of the flatness of the probe head, which houses the probes that input and output an electrical signal between different circuit structures, with respect to a predetermined reference surface.

Furthermore, according to the first embodiment, because the end faces of the post members come into contact with the surface of the space transformer, the surface of the space transformer and the surface of the reinforcing member become parallel to each other. Therefore, it is easy to make the surface of the probe head parallel to the surface of the reinforcing member, and it is not necessary to provide a complex adjustment mechanism for adjusting the parallelism. Consequently, the parallelism and the flatness of the probe head with respect to the predetermined reference surface can be obtained without increasing the number of components.

Figure 8:
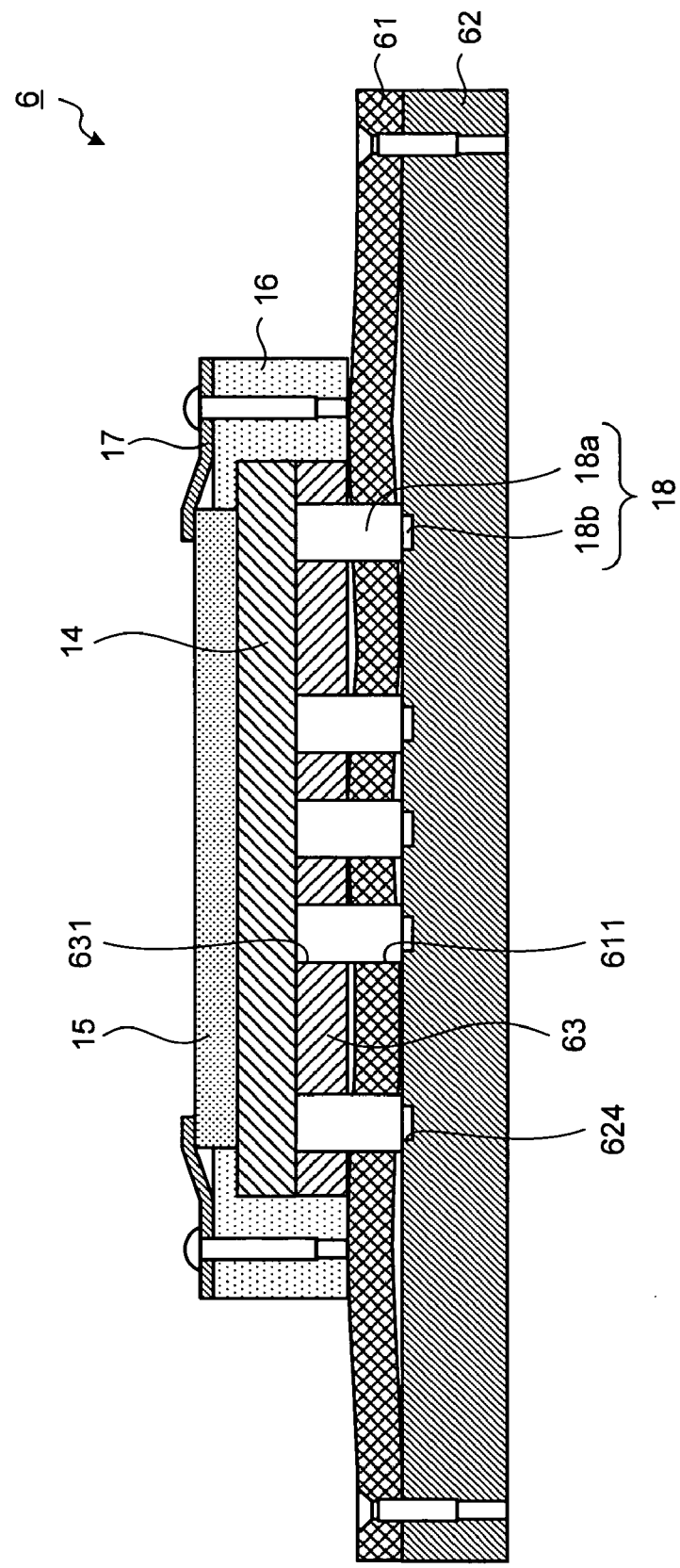
FIG. 8 is a partial sectional view showing the structure of a probe card according to a modified example of the first embodiment of the present invention.

FIG. 8 is a partial sectional view showing the structure of a probe card according to a modified example of the first embodiment. A probe card 6 shown in the figure includes a wiring board 61, a reinforcing member 62, an interposer 63, the space transformer 14, the probe head 15, the holding member 16, the leaf spring 17, and the plurality of post members 18.

The large diameter portions 18a are embedded to pierce through holes 611 and 631 that are respectively formed on the wiring board 61 and the interposer 63. The small diameter portions 18b of the post members 18 are placed on recesses 624 arranged in the reinforcing member 62.

In this modified example, the post members 18 are arranged in the central portion of the wiring board 61 and the interposer 63 in addition to surrounding areas of the wiring board 61 and the interposer 63. In this manner, in the first embodiment, arrangement positions of the post members 18 can be changed appropriately.

Second Embodiment

Figure 9:
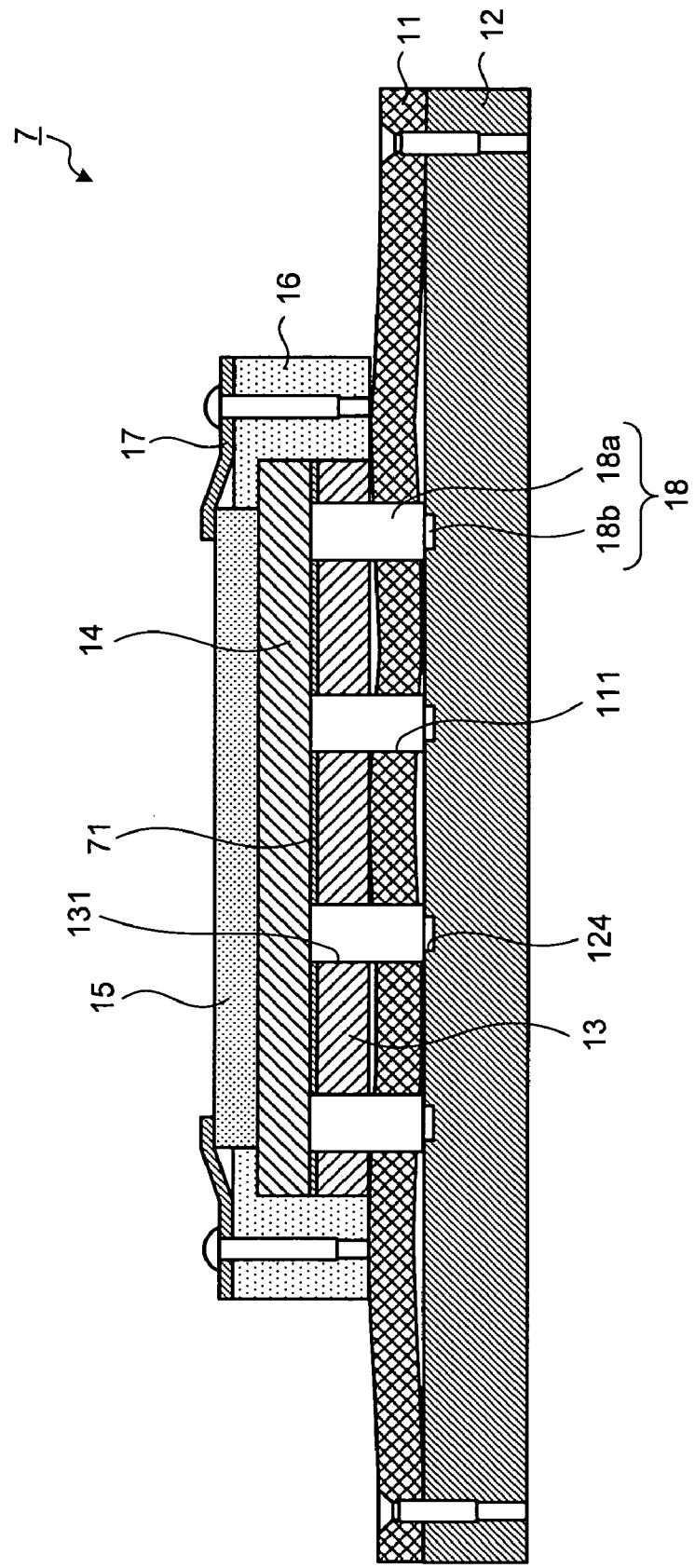
FIG. 9 is a partial sectional view showing the structure of a probe card according to a second embodiment of the present invention.

FIG. 9 is a partial sectional view showing the structure of a probe card according to a second embodiment of the present invention. In a probe card 7 shown in the figure, surfaces of the interposer 13 and the space transformer 14 facing each other are bonded by an adhesive 71. The structure of the probe card 7 except this point is the same as the structure of the probe card 1 of the first embodiment described above. Therefore, components corresponding to the components of the probe card 1 are denoted by the same symbols as those in FIG. 1 and the like.

In bonding the interposer 13 and the space transformer 14 by the adhesive 71, the adhesive 71 is arranged on the surface of the space transformer 14 excluding formation positions of the electrode pads 141 and contacting positions at which the post members 18 are brought into contact. When the adhesive 71 is liquid, the arrangement of the adhesive 71 is performed by brush coating, roller coating, spraying, coating by a spinner, immersion in the adhesive, or the like. When the adhesive 71 is semisolid or solid, the adhesive 71 is arranged by, after forming the adhesive 71 in a sheet shape of appropriate thickness, dissolving or dispersing the adhesive 71 into appropriate density by a solvent, a diluent, or the like and then performing the coating or the immersion explained above. Instead of use of the adhesive 71, it is possible to use thermosetting adhesives in a film shape or a sheet shape formed in a pattern excluding the formation positions of the electrode pads 141 and the contacting positions of the post members 18 on the surface of the space transformer 14.

As the adhesive 71, thermosetting adhesives such as epoxy resin, phenolic resin, urea resin, melamine resin, polyester resin, and silicone resin can be used. Thermoplastic adhesives such as polyvinyl acetate, polyvinyl alcohol, polyvinyl chloride, cellulose nitrate, and polyacrylic ester can also be used as the adhesive 71. In addition, pressure sensitive adhesives and thermo compression bonding adhesives can also be used as the adhesive 71.

A brazing material such as solder can also be used as the adhesive 71. When the brazing material has conductivity, after an oxide film is formed on the surface of the brazing material to impart insulating properties thereto, the brazing material is used as the adhesive 71. A melting point of the brazing material has to be higher than 200° C. that is the highest temperature during use of the probe card. However, if a melting point of metal for brazing is too high, distortion occurs when the temperature of the metal is reset to the normal temperature after the brazing. In view of these points, the melting point of the brazing material applied as the adhesive 71 is preferably higher than 200° C. and as low as possible.

When the interposer 13 and the space transformer 14 are bonded, first, the adhesive 71 is arranged on an attaching surface of any one of the interposer 13 and the space transformer 14 or both by any one of the methods explained above and brought into a semi-hardened state. Thereafter, after the interposer 13 and the space transformer 14 are stacked, the adhesive 71 is hardened. When the adhesive 71 is a thermosetting adhesive, the adhesive 71 is hardened by being heated to predetermined temperature or pressed in addition to the heating. When the adhesive 71 is a pressure sensitive adhesive, the adhesive 71 is hardened by being pressed at predetermined pressure. By hardening the adhesive 71 in this manner, the interposer 13 and the space transformer 14 are completely bonded to be integrated.

By bonding the interposer 13 and the space transformer 14 as explained above, compared with both the members simply stacked, it is possible to improve rigidity of the members as a whole and improve flatness of the space transformer 14. Consequently, flatness of the probe head 15 stacked on the space transformer 14 is also improved and flatness of the tips of the probes 2 housed and held by the probe head 15 is also improved. Therefore, accuracy of contact of the probes 2 with the semiconductor wafer 5 is increased.

According to the second embodiment of the present invention explained above, a plurality of post members are provided, which are formed in a substantially columnar shape with a height larger than the sum of the thickness of the wiring board and the thickness of the interposer, and embedded to pierce through the wiring board and the interposer in the thickness direction such that one of end surfaces of each post member comes into contact with the space transformer. Therefore, it is possible to improve accuracy of the parallelism and accuracy of the flatness of the probe head, which houses the probes that input and output an electrical signal between different circuit structures, with respect to a predetermined reference surface.

Furthermore, according to the second embodiment, the interposer and the space transformer are fixedly attached and integrated to each other. Therefore, it is possible to ensure proper strength and to prevent the space transformer from being deformed due to loads of the connection terminals arranged in the interposer.

The interposer and the space transformer can be bonded by a double-sided tape. The double-sided tape of a thin film shape is formed in a pattern excluding the electrode pads of the space transformer and is stuck to the surface of the space transformer, and then the interposer and the space transformer are stacked.

Furthermore, the interposer and the space transformer can be fixedly attached to each other by using a screw, instead of being fixedly attached by using an adhesive.

Moreover, the interposer and the space transformer can be fixedly attached to each other by using both an adhesive and a screw.

Third Embodiment

Figure 10:
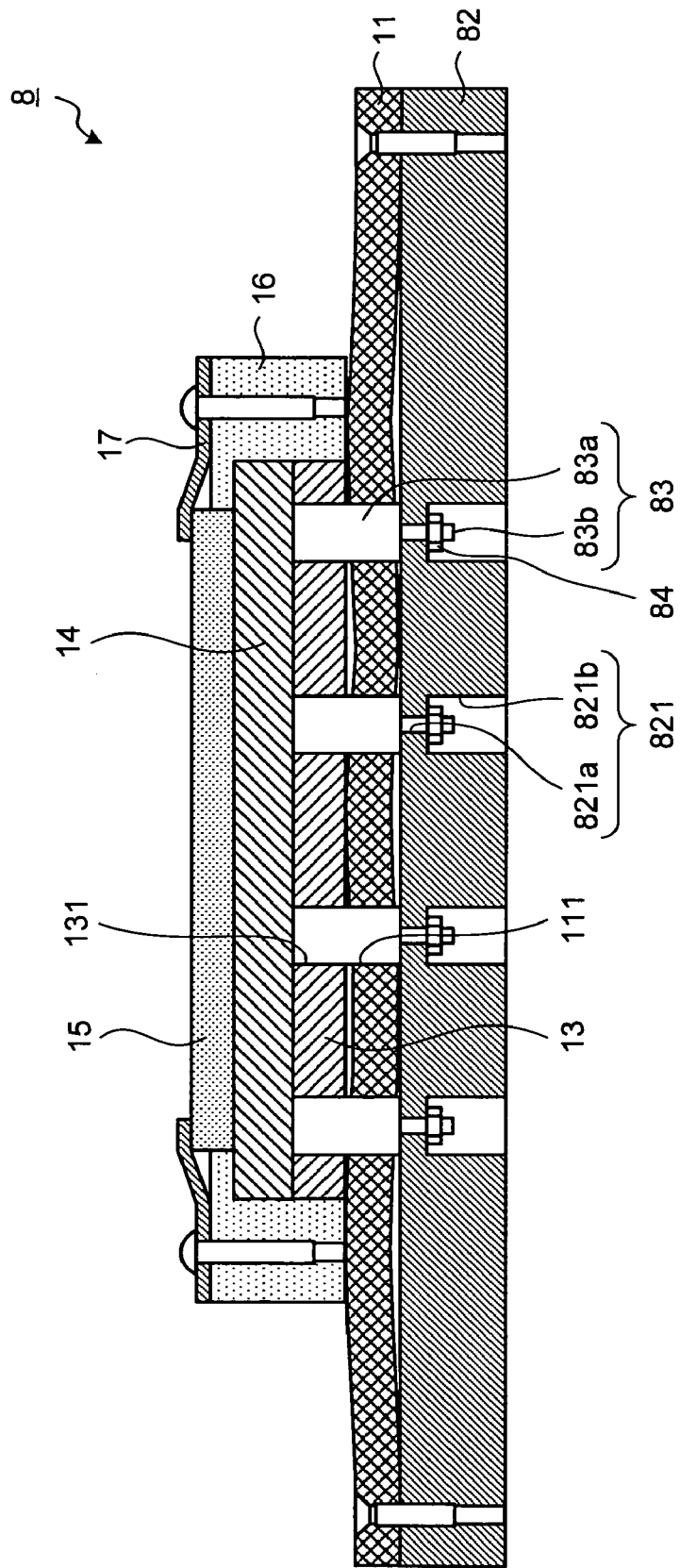
FIG. 10 is a partial sectional view showing the structure of a probe card according to a third embodiment of the present invention.
Figure 11:
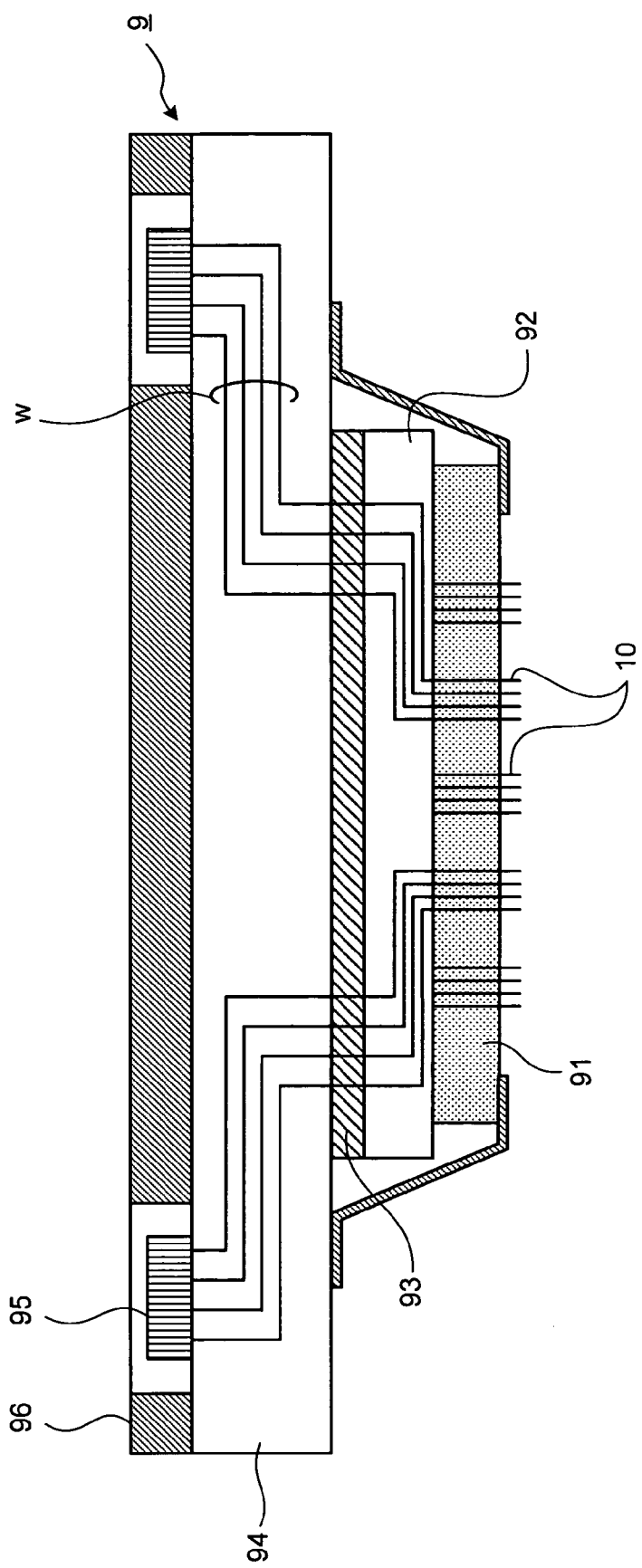
FIG. 11 is a partial sectional view showing the structure of a conventional probe card.

FIG. 10 is a partial sectional view showing the structure of a probe card according to a third embodiment of the present invention. A probe card 8 shown in the figure is characterized by post members fixed to a reinforcing member. The structure of the probe card 8 except the post members and the reinforcing member is the same as the structure of the probe card 1 of the first embodiment. Therefore, components corresponding to the components of the probe card 1 are denoted by the same symbols as those in FIG. 1 and the like.

Post members 83 include large diameter portions 83a that pass through the through holes 111 of the wiring board 11 and the through holes 131 of the interposer 13 and small diameter portions 83b fixed to a reinforcing member 82. Threads are arranged on surfaces of the small diameter portions 83b, and bolts 84 can be screwed in the threads.

Through holes 821 for fixing the post members 83 are arranged in the reinforcing member 82. The through holes 821 include small diameter holes 821a into which the small diameter portions 83b of the post members 83 are inserted, and large diameter holes 821b that have the same axes as those of the small diameter holes 821a and have a diameter larger than a diameter of the bolts 84 to be screwed in the small diameter portions 83b.

According to the third embodiment of the present invention explained above, a plurality of post members are provided, which are formed in a substantially columnar shape with a height larger than the sum of the thickness of the wiring board and the thickness of the interposer, and embedded to pierce through the wiring board and the interposer in the thickness direction such that one of end surfaces of each post member comes into contact with the space transformer. Therefore, it is possible to improve accuracy of the parallelism and accuracy of the flatness of the probe head, which houses the probes that input and output an electrical signal between different circuit structures, with respect to a predetermined reference surface.

Furthermore, according to the third embodiment, because the post members are fixed to the reinforcing member, it is possible to realize a stronger structure of the probe card.

The attachment of the post members to the reinforcing member can be performed by using a method other than the method described above.

As described above, the first to the third embodiments are explained in detail as the best modes for carrying out the present invention; however, the present invention is not limited by these embodiments. For example, although the above explanation is given with use of an example in which a pin type probe is applied, a probe to be applied to the probe card of the present invention can be any one of conventionally-known various types of probes.

The invention in its broader aspects is not limited to the specific details and representative embodiments shown and described herein. Accordingly, various modifications may be made without departing from the spirit or scope of the general inventive concept as defined by the appended claims and their equivalents.

INDUSTRIAL APPLICABILITY

As described above, the probe card according to the present invention is useful for performing an electric characteristic test for a semiconductor wafer and is particularly suitable for performing a full wafer level test in which several hundreds to several ten thousands probes are collectively brought into contact with at least a quarter to a half of dies on the semiconductor wafer.

The invention claimed is:

1. A probe card that electrically connects, using a plurality of probes, a semiconductor wafer and a circuit structure for generating a signal to be output to the semiconductor wafer, each probe is made of a conductive material and is extensible and compressible by elastic force along a longitudinal direction thereof, the probe card comprising:
   a probe head that holds the plurality of probes;
   a wiring board that has a wiring pattern corresponding to the circuit structure;
   a flat interposer that is stacked on the wiring board and relays wirings of the wiring board;
   a flat space transformer that is placed between the interposer and the probe head, transforms a space between the wirings relayed by the interposer, and leads the transformed wirings out to a surface facing the probe head;
   a plurality of post members that are formed in a substantially columnar shape with a height larger than a sum of a thickness of the wiring board and a thickness of the interposer, and embedded to pierce through the wiring board and the interposer in a thickness direction such that one of end surfaces of each post member comes into contact with the space transformer,
   wherein the interposer comprises
   a plurality of connection terminals, each of which is made of a conductive material and is extensible and compressible by elastic force along a longitudinal direction thereof; and
   a housing member that is made of a flat insulating material and includes a plurality of through holes to individually house the connection terminals, and
   both ends of each of the connection terminals in the longitudinal direction are exposed from the housing member.

2. The probe card according to claim 1, wherein the interposer and the space transformer are fixedly attached to each other.

3. The probe card according to claim 1, further comprising a reinforcing member that is attached to the wiring board and reinforces the wiring board, wherein
   the plurality of post members are fixedly attached to the reinforcing member.

* * * * *